United States Patent [19]
Parrish

[11] Patent Number: 4,633,086
[45] Date of Patent: Dec. 30, 1986

[54] INPUT CIRCUIT FOR INFRARED DETECTOR

[75] Inventor: William J. Parrish, Hope Ranch, Calif.

[73] Assignee: Grumman Aerospace Corporation, Bethpage, N.Y.

[21] Appl. No.: 721,425

[22] Filed: Apr. 9, 1985

[51] Int. Cl.[4] .............................................. H01L 27/14
[52] U.S. Cl. .................................... 250/338; 250/370; 323/312
[58] Field of Search ............. 250/332, 338 SE, 338 R, 250/370 JX, 370 G, 370 R; 307/297; 357/32; 323/311, 312

[56] References Cited

U.S. PATENT DOCUMENTS

| | | | |
|---|---|---|---|
| 3,787,668 | 1/1974 | Currie et al. | 235/152 |
| 3,970,875 | 7/1976 | Leehan | 307/304 |
| 3,975,648 | 8/1976 | Tobey, Jr. et al. | 307/297 |
| 4,004,148 | 1/1977 | Howard et al. | 250/370 |
| 4,007,415 | 2/1977 | Toyoda | 323/10 |
| 4,045,675 | 8/1977 | Kingsley et al. | 250/370 |
| 4,054,797 | 10/1977 | Milton et al. | 250/332 |
| 4,064,448 | 12/1977 | Eatock | 323/221 |
| 4,115,692 | 9/1978 | Balcerak | 250/338 |
| 4,152,595 | 5/1979 | Garfinkel et al. | 307/350 |
| 4,179,691 | 12/1979 | Keller | 340/567 |
| 4,243,885 | 1/1981 | Agouridis et al. | 250/370 |
| 4,257,957 | 3/1981 | Cheung | 357/34 |
| 4,303,861 | 12/1981 | Ekstrom | 250/370 |
| 4,418,335 | 11/1983 | Genahr | 340/565 |
| 4,431,920 | 2/1984 | Srour | 250/370 |
| 4,435,652 | 3/1984 | Stevens | 307/297 |
| 4,499,416 | 2/1985 | Koike | 323/303 |

OTHER PUBLICATIONS

*Infrared Detectors*, "Detectivity and Preamplifier Considerations for Indium Antimonide Photovoltaic Detectors", G. R. Pruett and R. L. Petritz, Hallsted Press (1959), pp. 1524–1529.
*Electronics,* 2/3/77, pp. 96–100.

*Primary Examiner*—Janice A. Howell
*Assistant Examiner*—Constantine Hannaher

[57] ABSTRACT

A method and circuit are provided for interfacing an infrared detector to a common power supply and signal processing circuitry. A multichannel input circuit including a plurality of buffer circuits and a common bias network is formed on a single semiconductor substrate. The common bias network reduces the necessary connections between the substrate and the external power supply. The bias network is operative to reduce power level variations in the signal from the external power supply. Each channel includes a negative feedback circuit to maintain a dedicated detector in a zero bias condition, thus reducing 1/f noise and enhancing the signal-to-noise ratio of the circuit. The load to each channel is adjustable to maintain the detector in the zero bias condition.

19 Claims, 3 Drawing Figures

INPUT CIRCUIT FOR INFRARED DETECTOR

The present invention relates to circuitry for interfacing an infrared detector to a common power supply and to a processing network that stores and interprets detected infrared frequency signals.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range corresponding to the particular detection function of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation can be derived.

Photo-type detectors (eg., photoconductive and photovoltaic detectors, absorb the infrared frequency energy directly into the electronic structure of the material, inducing an electronic transition which leads to a change in the electrical conductivity (photoconductors) or to the generation of an output voltage across the terminals of the detector (photovoltaic detectors). The precise change that is affected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, advances in semiconductor materials and the development of highly sensitive electronic circuitry have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analyzing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.009 centimeters on a side with 0.00127 centimeters spacing between detectors. Such an array would therefore be 2.601 centimeters on a side. Thus, interconnection of such a subarray to processing circuitry requires a connective module with sufficient circuitry to connect each of the 65,536 detectors to processing circuitry within a square, a little more than one inch on a side. The subarray may, in turn, be joined to form an array that connects to 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on focal plane or up front signal processing, reductions in size, power and cost of the main processor may be achieved. Moreover, up front signal processing helps alleviate performance, reliability and economic problems associated with the construction of millions of closely spaced conductors connecting each detector element to the main signal processing network.

In view of the minimal available space, it is also desirable to reduce the number of conductors connecting each integrated circuit chip to external circuitry that facilitates chip operation. Because each chip may perform up front signal processing for 50–100 dedicated detector channels, it is clearly preferable to utilize common circuitry connecting the chip to external circuitry such as power supply, rather than separately connecting each detector channel to that circuitry. Such common connections serve to ease conductor congestion and reduce power consumption.

Aside from the aforementioned physical limitations on the size of the detector module, limitations on the performance of contemporary infrared detectors arise due to the presence of noise intermixed with the signal generated by the detector. In general, such noise may be a consequence of background conditions at the site of the detector, generated from within the detector itself or generated as a consequence of the interconnected electronic circuitry. Unless eliminated from the detected signal, those noise components establish the minimum level of detectivity obtainable from the detection circuit.

Cooling the detector to extremely low temperatures is effective to reduce random electronic activity within the detector and therefore reduce some components of the noise spectrum. Filters and well known electronic signal processing techniques are also effective to reduce background noise levels permitting enhancement of the signal-to-noise ratio of the detector circuit.

Another type of noise that is particularly significant when the detector operates in certain regions of the infrared frequency spectrum is commonly referred to as modulation noise, or "1/f noise." The term 1/f noise generally refers to noise in the semiconductor detector that is due to modulation of the detector conductivity. 1/f noise increases dramatically as the biasing current through the detector increases. Because 1/f noise can be the principal noise component at certain frequencies of operation, it is highly desirable that the detector biasing current be reduced as much as possible while retaining high gain and low power levels in the detector circuit. Though other circuits have been proposed that provide zero bias voltage across the infrared detector to reduce 1/f noise, those circuits suffer from one or more common deficiencies. One of those deficiencies concerns the ability of the circuit to achieve the desired operating point, i.e. at the zero bias condition, uniformly over a large number of inputs, despite differences in the threshold levels of the particular semiconductors incorporated into the circuit. Variations with regard to those threshold levels, as well as variations in the precise resistance of other components may change the operating conditions such that maximum reduction of noise levels is not consistently obtainable without persistent measurements and adjustments.

Another deficiency of contemporary zero biasing circuits relates to the intrinsic topology of the buffer circuits that are interconnected to the detectors. Preferably buffer circuits operate at very small signal levels and generate discernable output signals upon the application of a small signal upon the gate of the device. Thus, power consumption and power dissipation requirements are minimized without sacrificing sensitivity to low level inputs. Some existing buffer circuits incorporate semiconductor devices such as bipolar transistors, which suffer from the requirement that too large a current be applied to the base in order to turn on the circuit, thereby reducing sensitivity. Other circuits that incorporate devices operating in a normally on condition, i.e. above threshold, may draw too much current when activated by a signal responsive to irradiation of the detector.

SUMMARY OF THE INVENTION

Accordingly, a method and circuit are provided for interfacing an infrared detector to an external power supply and signal processing circuitry. The circuit is characterized by low noise level operation, low power consumption and low cross-talk, while providing near unity gain of the input signal current and stable operation. The invention comprises a multichannel buffer circuit and a bias network formed on a common semiconductor substrate. The bias network is operative to reduce variations in input power levels and communicate a low level bias signal to each channel. The bias signal to each channel is substantially the same and sufficient to bias each channel into a linear region of operation. Each buffer circuit channel preferably comprises an input field effect transistor (FET) having a gate connectable to a first lead of an infrared photodetector (eg., a HgCdTe photovoltaic detector), a source connectable to a constant current supply and a drain connected to a load FET. A feedback FET is connected at its gate to the drain of the input FET and at its source to the gate of the input FET. The drain of the feedback FET is connectable to filtering and multiplexing circuitry leading to a signal processing network. The load FET is adapted to operate as a constant current load to the input FET at a current level equivalent to the current flow through the input FET when the gate of the input FET is at a reference voltage potential, i.e. when the gate voltage is equivalent to the voltage applied to the second lead of the detector. Thus, the input FET is designed to operate at conditions corresponding to approximately zero voltage drop across the detector leads, resulting in zero bias current through the detector.

The feedback FET is operative to receive at its gate any current output from the input FET in excess of the fixed current load drawn by the load FET. The excess current is translated into a negative feedback signal that is used to maintain the input of the gate to the input FET at the reference voltage level, to thereby maintain zero bias current through the detector. The feedback FET also functions to reduce the input impedance of the circuit to less than the impedance of the detector, thereby facilitating maximum current injection from the detector into the circuit.

Self-regulating operation of each buffer circuit channel is effected by temporarily shorting the detector leads to directly connect the gate of the input FET to the reference voltage and temporarily shorting the gate and drain of the load FET to place the load FET in a saturation condition at a current level responsive to the reference voltage level on the gate of the input FET. Both shorts are then opened to allow regulated operation of the buffer circuit. The voltage on the gate of the load FET is maintained by the capacitance between the gate and source of the load FET.

In order to implement the device in a topology that provides low power dissipation levels to minimize the introduction of various noise components the buffer circuit is preferably implemented using a complementary metal oxide semiconductor construction.

DETAILED DESCRIPTION OF THE PREFERRED EMBODIMENT

Figure 1:
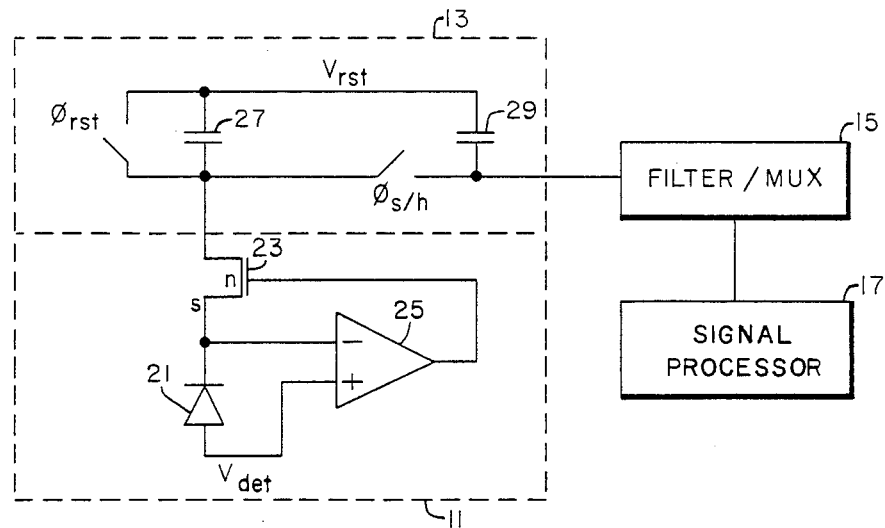
FIG. 1 is a simplified schematic representation of a buffer circuit operative to connect a detector to a processing network.

Referencing FIG. 1, a simplified schematic representation of an input circuit for an infrared detection system is shown therein illustrating the interconnections between a buffer circuit 11, sampling and holding circuit 13, filter/multiplexer 15 and signal processor 17. In practice, the various components of buffer 11, sample and hold circuit 13 and filter/multiplexer 15 may be formed on a small portion of a semiconductor. Circuits 11, 13 and 15 may be redundantly formed on the substrate electrically connected to a planar array of detectors, e.g., 8 detectors wide by 1000 detectors long. Each detector element is preferably connected to a dedicated channel with a large number of input circuits disposed on a single integrated circuit chip. The outputs from each channel may be communicated to a single, external signal processor adapted to interpret the various inputs from the channels in accordance with any of a variety of well known signal processing techniques.

Buffer circuit 11 connects a dedicated detector 21 to signal processing circuitry 17. As described below, bias network 31 (shown at FIG. 3) commonly biases each buffer circuit channel into a linear region of operation, thereby enhancing detectivity of the channel. Though the buffer circuit is shown at FIG. 1 in connection with exemplary sampling and filter/multiplexing circuitry that condition the detected signal for signal processing, it is anticipated that various types of sampling and filter/multiplexing circuitry could be adapted for use in connection with the present invention. Similarly, in its broader aspects, the buffer circuit may be adapted for use with a variety of different detectors.

Infrared detector 21 is preferably a photovoltaic detector formed using material such as a Mercury Cadmium Telluride (HgCdTe) in accordance with techniques well known to those in the art. Other detectors may be utilized in accordance with the particular detection function to be performed.

The exemplary circuit set forth at FIG. 1 is constructed and operates as follows. The anode of detector 21 is commonly connected to the source of FET 23 and one negative terminal of amplifier 25. The positive terminal of amplifier 25 is connected to the cathode of detector 21 which is at a reference voltage level $V_{det}$. The output of amplifier 25 feeds the gate FET 23. The drain of FET 23 is connected to sample and hold circuit 13, which includes reset switch $\emptyset_{rst}$, sample and hold switch $\emptyset_{s/h}$ and capacitors 27 and 29. The upper plate of capacitors 27 and 29 is charged to the level $V_{rst}$. When $\emptyset_{rst}$ is closed, capacitor 27 is shorted and $V_{rst}$ is applied to the drain of FET 23. When $\emptyset_{s/h}$ is closed, the voltage on the drain of FET 23 is applied to capacitor 29 where it is stored and ultimately forwarded to filter/multiplexer 15 and then to signal processor 17.

In operation, the circuit of FIG. 1 may be viewed as an auto-zero biasing circuit that detects an output from detector 21 on the negative (−) terminal of amplifier 25 and communicates a signal to the gate of FET 23 in response to the detected signal. The signal on the gate of FET 23 will, in turn, vary the conductance of FET 23 so as to permit current to flow through FET 23 to restore the negative terminal of amplifier 25 to the level $V_{det}$. Thus, the voltage potential across detector 21 remains at approximately zero. As the conductance of FET 23 is varied to compensate for the signal from detector 21, the voltage level on the drain of FET 23 is reduced from the level $V_{rst}$. That reduced level is communicated to capacitor 29 as $\emptyset_{s/h}$ is closed and thereafter communicated to filter/multiplexer 15 and signal processor 17. As explained below, a principal feature of the invention resides in a technique for implementing amplifier 25, and the biasing circuitry therefor, in a manner so as to compensate for component and biasing tolerances within the amplifier circuit such that current regulating FET 23 remains independent of those tolerances.

Details of the function and structure of the presently preferred embodiment of an input circuit that implements the function of buffer circuit 11 and the bias network are set forth in connection with FIGS. 2 and 3. Referencing FIG. 2, the buffer circuit there illustrated consists of an input MOSFET M1, a load MOSFET M2 and a feedback MOSFET M3. The input to the circuit from infrared detector 21 is fed through the gate of input MOSFET M1. The output of the circuit is derived from feedback MOSFET M3 through sample and hold circuit 13 and filter/multiplexer circuit 15 (shown at FIG. 1).

M1 is preferably implemented as a P-channel input transistor (MOSFET) which generates a drain current dependent on the detector voltage at the input gate. M1 provides high gain to the signal from the detector 21. As the circuit is presently constructed it is anticipated that M1 is the input circuit dominant noise source.

M1 is biased by current from bias network 31 (see FIG. 3) to be in the lower portion of its linear region of operation, as will be well understood by those of ordinary skill in the art. Because M1 bias current is characterized by reduced current level variations, the M1 bias current can be closely matched to the threshold characteristics of the particular substrate on which M1 is implemented Thus, power consumption of the buffer circuit may be minimized. Moreover, because each channel of the multichannel module is preferably implemented on a common substrate threshold, characteristics of each channel are substantially the same. Therefore, the bias level may be selected without the need to provide a current margin to accommodate variations in component operating characteristics. Accordingly, power consumption and power dissipation of the circuit are reduced without sacrificing the sensitivity of the circuit to low level sources of infrared radiation. As described below, buffer circuit 11 incorporates adaptive self-regulating circuitry that further compensates for variations in component operating characteristics and bias levels.

M2 is preferably an N-channel load transistor (MOSFET) for M1. The saturation drain current in MOSFET M2 is set to be equal to the current of M1 when switch $\emptyset_{rstor}$ is closed and the gate of M2 is connected to its drain. When $\emptyset_{rstor}$ is opened, M2 becomes a constant high impedance current source load for M1 as the gate to source voltage is held across $C_1$.

M3 is preferably an N-channel common gate input transistor (MOSFET). Current through detector 21 flows through M3. The gate of M3 is connected to the output of the M1-M2 inverting amplifier. The gate potential varies to keep the voltage across the detector constant (preferably at zero volts).

In the presently preferred embodiment the ratio of the transconductance, $g_m$, of M1 to $g_m$ of M2 is the gain of the amplifier with $\emptyset_{rstor}$ closed, which is simulated to be approximately 18.4. The resistance of the switches $\emptyset_{zero}$ and $\emptyset_{rstor}$ is between 3k–7k ohms, which is significantly lower than the detector impedance, which is approximately 20K ohms, and, therefore, will yield very short RC time constants for resetting and sample and holding.

Due to the negative feedback, the input impedance seen by the detector 21 is reduced by the feedback amplifier gain (A) beyond the non-feedback input impedance ($g_m{}^{-1}$) of the input MOSFET M1. Therefore, the input impedance becomes:

$$Z_{in} = [g_m(1+A)]^{-1}$$

Utilizing the exemplary circuit parameters set forth below at Table 1, virtually all of the detector current is coupled into the buffer circuit as the imput impedance is made very low, approximately 20K ohms.

Figure 2:
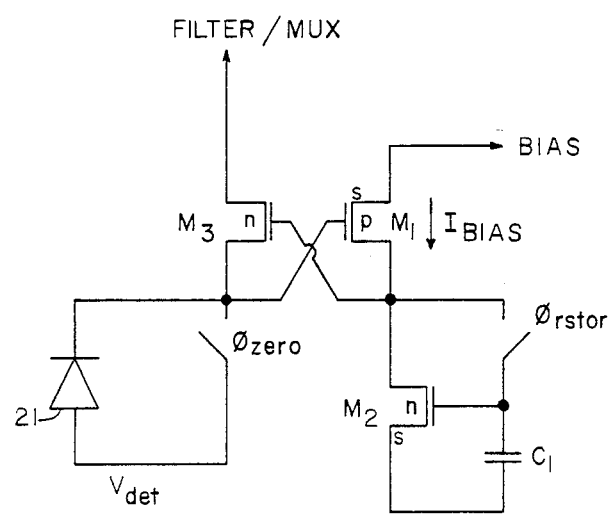
FIG 2 is a more detailed schematic representation of a buffer circuit illustrating a method of zero biasing the detector.

The operation of the buffer circuit of FIG. 2 is as follows. By closing the switch $\emptyset_{zero}$, the detector 21 is short-circuited so that the voltage level $V_{det}$ appears on both the cathode and anode of diode 21. The reference potential $V_{det}$ accordingly also appears in the gate of M1 and on the source of M3. Switch $\emptyset_{rstor}$ is also closed so that the load to input FET M1 is reduced and the voltage on the drain of M1 is also communicated to the gate of M2. When $\emptyset_{rstor}$ is opened the gate of M2 is held at the level established when $\emptyset_{rstor}$ was closed by the charge stored on capacitor C1. Opening $\emptyset_{rstor}$ also increases the impedance of the load circuit, thereby increasing the gain of M1. The charge on C1 is effective to place M2 in a saturation condition such that it operates as a constant current load on M1. So long as the switch $\emptyset_{zero}$ remains closed and, therefore, the gate of M1 remains at the reference potential, $V_{det}$, the current through M2 is equivalent to the current through M1 and little or no current is directed to the gate of feedback MOSFET M3.

When $\emptyset_{zero}$ is opened the gate potential of M1 may vary as a consequence of irradiation of detector 21 by infrared frequency energy. As detector 21 absorbs infrared frequency energy the photovoltaic detector 21 generates a voltage which places the gate of MOSFET M1 at a higher potential than the reference potential $V_{det}$. As a consequence of the voltage on the gate of M1 the conductivity of M1 is changed such that more current flows through M1 than the previous, constant current level consumed by load MOSFET M2. The current in excess of that constant current load is communicated to the gate of M3 and varies the conductance of M3 causing the source of M3 to become more negative, thereby restoring the gate of M1 to the $V_{det}$ level. Thus, the buffer circuit is self regulating or adaptive to the operating conditions of the particular components to adjust the circuit load without the need for measurements or manual adjustments. Once adapted to the desired operating level, e.g. gate of M1 at zero volts, the buffer circuit is operative to maintain the voltage on both sides of the detector 21 at the $V_{det}$ level through the use of negative feedback. Accordingly, current flow through detector 21 approaches zero and 1/f noise is reduced so as to enhance the signal-to-noise ratio of the buffer circuit.

Figure 3:
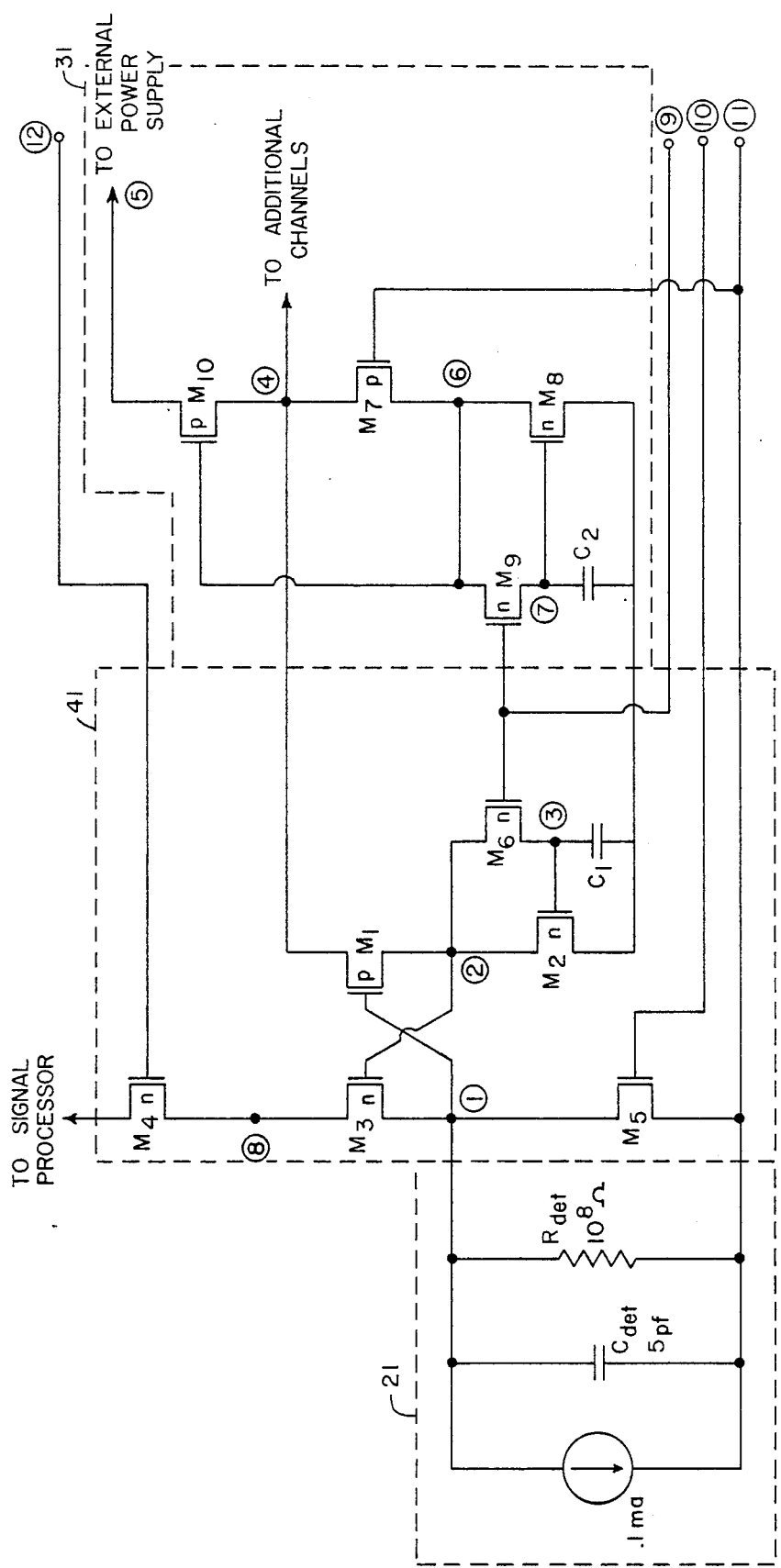
FIG. 3 is a detailed illustration of the presently preferred embodiment of the bias network and one channel of the buffer circuit connecting the detector to the filter/multiplexer circuit.

As shown in FIG. 3, the switches $\emptyset_{zero}$ and $\emptyset_{rstor}$ may be implemented by additional MOSFET devices which, in addition to the bias network 31 illustrated at FIG. 3, may be incorporated onto the chip including the buffer circuit. Information relating to the preferred parameters of each of the components illustrated in FIG. 3, as well as the anticipated voltage levels at the numbered nodes illustrated at FIG. 3 is set forth below at Tables 1, 2, 3 and 4. The additional MOSFETs that may be incorporated into the buffer circuit (i.e. M4, M5 and M6) are preferably designed as follows: M4 is constructed as an N-channel isolation transistor that functions to prevent clock feed through from the large reset integrator voltage swing in the sample and hold circuit 13 from capacitively coupling onto the gate of M3. M5 is constructed as an N-channel switch transistor that functions to short the input to a reference potential during the zeroing operation. It should be understood that though the reference potential ($V_{det}$) is preferably established as ground potential, another reference potential level may be selected within the scope of the invention. M6 is constructed as an N-channel transistor switch that functions to sample and hold the resulting gate to source potential of M2 across C1 during the zeroing process. As previously described, when M6 (and M5) are open the input potential is varied by M3 to force the current through M1 to equal M2, assuming M1 and H2 are in their normal operating regions. Because the drain current of M2 was set when the gate of M1 was held at the reference level, the input remains at the reference level when M5 and M6 are opened.

The on-chip bias network 31 shown in FIG. 3 is designed to desensitize the input bias current to threshhold variations in the various channels of detectors 21 and buffer circuits 41. The bias network operates by summing the current from each of the individual channels (64 channels in the presently preferred embodiment) through a single MOSFET, M10. Accumulative currents of all input channels generate enough current (approximately) 1 microamp) to cause M10 gate-to-source voltage to be well above threshhold, and significantly greater than the expected threshhold variations (approximately 100 mv.). In this manner variations of threshhold from die to die will not appreciably change the overall bias current and M10 will remain in a conductive condition in a linear operational region. A feedback amplifier (a mirror image of the buffered autozero amplifier connecting the output of M7 to gate of M10) serves to reduce the node impedance at the collective sources of the M1 MOSFETS. Because the feedback amplifier is a duplicate of the buffer circuit auto-zero stage, it also serves to reduce cross talk between channels and compensates for any clock feed through offsets.

The feedback amplifier within bias network 31 serves to reduce power level variations felt at the output to M10 to levels which, when communicated to each of the M1's, will not cause the channel bias signal to fall below the threshold requirements of the M1's, and will keep each M1 in its linear operational region. In implementation it has been found that the bias network of the present invention is effective to reduce power level variations to approximately one-tenth of the power level variations present in the signal received from the external power supply.

Because each buffer circuit connected to bias network 31 is formed on a common substrate, the threshold requirements of the M1's are substantially identical. Thus, the bias network can be effective to predictably bias each channel marginally above the threshold requirements without significant risk that any of the biased semiconductor will fall below the threshold levels, thus minimizing power consumption and power dissipation requirements for the circuit. When bias network 31 is utilized in conjunction with multiple buffer circuit 11 channels, each detector element in the interconnected array may therefore be uniformly zero biased despite threshold differences in the individual components, and variations in the power level provided by a power source.

It is further recognized that by leaving $\emptyset_{rstor}$ on continuously, with $\emptyset_{zero}$ off, the amplifier operates as a normal buffered current amplifer stage with the input bias subject to variations in threshhold and a lower feedback gain.

TABLE 1

| Input | Bias | Type | Geometry |
|---|---|---|---|
| M1 | M7 | P | 1000/20 |
| M2 | M8 | N | 20/200 |
| M3 | — | N | 60/10 |
| M4 | — | N | 10/10-own P-well |
| M5 | — | N | 6/6 |
| M6 | M9 | N | 6/6 |
|  | M10 | P | 10/50 |

TABLE 2

| Capacitance | |
|---|---|
| C1 | Approx. 1.8 pf. |
| C2 | Approx. 1.8 pf. |

TABLE 3

| Node | Voltage |
|---|---|
| 1 | 0.1 |
| 2 | 1.23 |
| 3 | 1.23 |
| 4 | 2.63 |
| 5 | 4.20 |
| 6 | 1.23 |
| 7 | 1.23 |
| 8 | 3.03 |
| 9 | 5.00 |
| 10 | 5.00 |
| 11 | 0.10 |
| 12 | 15.00 |

TABLE 4

| MOSFET | Type | Vgs | Vds | Vbs | Id |
|---|---|---|---|---|---|
| M1 | P | −2.536 | −1.397 | 12.364 | $-1.450^{-8}$ |
| M2 | N | 1.230 | 1.328 | 0.0 | $1.450^{-8}$ |
| M3 | N | 1.138 | 2.938 | −0.100 | $3.048^{-12}$ |
| M4 | N | 1.162 | 1.162 | 0.0 | $9.137^{-11}$ |
| M5 | N | 4.900 | 0.000 | −0.100 | $-1.001^{-10}$ |
| M6 | N | 3.762 | 0.000 | −1.238 | $2.496^{-12}$ |
| M7 | P | −2.536 | −1.397 | 12.374 | $-1.450^{-8}$ |
| M8 | N . | 1.238 | 1.238 | 0.0 | $1.449^{-8}$ |
| M9 | N | 3.762 | 0.000 | −1.238 | $2.496^{-12}$ |
| M10 | P | −2.962 | −1.564 | 10.080 | $-9.413^{-7}$ |

What is claimed is:

1. An input circuit for a multichannel infrared detection system comprising a bias network connectable to the output of an external power supply, and a plurality of detector channels, each of said channels being connectable to a dedicated detector element and having at least one semiconductor device commonly connected to said bias network, said detector channels and said bias network being formed on a common semiconductor substrate, said bias network including circuitry to reduce power level variations present in the output from the external power supply and to thereby generate a low level bias signal, said bias signal being sufficient to bias at least one detector channel semiconductor device in each detector channel into a linear region of operation.

2. The circuit as recited in claim 1 wherein each of said detector channels is substantially identical.

3. The circuit as recited in claim 2 wherein each of said commonly connected detector channel semiconductor devices have substantially the same threshold level.

4. The circuit as recited in claim 1 wherein each of said detector channels receives substantially the same low level bias signal from said bias network.

5. The circuit as recited in claim 2 wherein said bias network comprises a feedback circuit disposed in parallel electrical relation to said detector channels, said feedback circuit being operative to facilitate said reduced power level variations and to reduce cross talk between detector channels.

6. The circuit as recited in claim 5 wherein said feedback circuit is substantially identical for each of said detector channels.

7. The system as recited in claim 5 wherein said bias network is operative to reduce power level variations to approximately one-tenth of the power level variations in the output from the external power supply.

8. The circuit as recited in claim 4 wherein the input circuit includes 64 detector channels.

9. The circuit as recited in claim 8 wherein said bias signal to each detector channel is approximately 40 nanoamps.

10. The circuit as recited in claim 1 wherein each of said detector channels comprises:
    an input circuit;
    a load circuit; and
    a feedback circuit;
    said input circuit comprising an input FET having a gate connectable to a first lead of a dedicated detector element, a source connected to said bias network and a drain connected to said load circuit;
    said feedback circuit comprising a feedback FET having a gate connected to the drain of said input FET, a source connected to the gate of said input FET and a drain connectable to signal processing circuitry;
    said load circuit comprising a load FET and adaptive biasing circuitry connected thereto, said load FET having a drain connected to said input FET drain and a source connected to a reference voltage, said adaptive biasing circuitry being operative to maintain said load FET in a conductive condition such that said load circuit functions as a constant current load to said input FET, said constant current load being at a load level corresponding to the output of said input FET when said reference voltage is applied to the gate of said input FET;
    said feedback FET being operative to receive the output of said input FET in excess of said constant load level so as to regulate the conduction of said feedback FET to thereby maintain the gate of said input FET at approximately said reference voltage.

11. The circuit as recited in claim 10 wherein said input FET circuit further comprises a first switch connected to the gate of said input FET and to said reference voltage level, said first switch being operative to apply said reference voltage level to the gate of said input FET thereby short circuiting said detector.

12. The circuit as recited in claim 10 wherein said adaptive biasing circuitry comprises:
    a capacitor having first lead connected to the gate of said load FET and a second lead connected to the source of said load FET; and
    a second switch connected to the drain and to the gate of said load FET, said second switch being adapted to be temporarily closed, upon the closure of said first switch, to apply a first voltage to the gate of said load FET, said first voltage being maintained on the gate of said load FET by said capacitor when said second switch is opened.

13. The circuit as recited in claim 10 further comprising a HgCdTe detector element connected to each of said detector channels.

14. A method of generating signal levels for providing low level biasing for a multichannel infrared detection circuit, the method comprising the steps of:
receiving a signal from an external power source at the input of a common bias network for a multichannel infrared detection circuit, said bias network and each channel of said multichannel detector circuit being formed on a common semiconductor substrate;
commonly connecting each channel of said multichannel bias circuit to an output of said bias network, said common connections being effective to collectively load said bias network into a linear operational condition;
reducing power level variations in said received signal to form a low level bias signal for communication to each of said channels; and
communicating said low level bias signal to each of said detector channels, said bias signal being sufficient to bias each of said channels into a linear operational region.

15. The method as recited in claim 14 further including the steps of reducing the impedance at said common connection to said bias network and preventing cross talk between channels of said multichannel detector circuit.

16. The method as recited in claim 14 further including the steps of:
connecting a first lead of an infrared detector to the input of a dedicated channel of said multichannel detector circuit, each channel comprising an input circuit, a load circuit and a feedback circuit;
connecting a second lead of said detector to a reference voltage;
temporarily shorting at least a portion of the input and load circuits to adaptively set said channel for stable operation when the input to said channel is at said reference voltage, thereby causing the voltage across said detector to be zero volts;
generating an output from said detector in response to infrared irradiation of said detector; and
generating a variable feedback signal in response to the output of said detector, said feedback signal being effective to maintain the input to said channel at approximately said reference voltage.

17. The method as recited in claim 16 wherein said step of temporarily shorting at least a portion of the input and load circuits to adaptively set said channel for stable operation comprises the steps of:
shorting said first and second leads of said detector; and
biasing said load circuit to operate as a constant current load to said input circuit, said constant current load level corresponding to the output of said input circuit upon the application of said reference voltage to said input circuit.

18. The method as recited in claim 16, wherein the step of generating a variable feedback signal comprises the step of:
applying the output from said input circuit, in excess of said constant current load level, to said feedback circuit so as to cause said feedback circuit to maintain the channel input at said reference voltage.

19. A method of generating a signal in response to irradiation of an infrared detector comprising the steps of:
receiving a signal from external power supply at the input of a common bias network of a multichannel infrared detection circuit, said bias network and each channel of said multichannel detector circuit being formed on a common semiconductor substrate, each of said channels comprising an input FET, a load FET and a feedback FET;
connecting a first lead of a dedicated infrared detector to the gate of said input FET, said input FET having a source connected to a common output of said bias network and a drain connected to both the source of said load FET and to the gate of said feedback FET, said input FET in each of said channels receiving approximately the same bias signal from said bias network, said bias signal being sufficient to bias said input FET in each of said channels into a linear operational condition;
connecting a second lead of said detector to a reference voltage;
connecting the source of said feedback FET to the gate of said input FET;
connecting a storage device between the gate and source of said load FET;
temporarily shorting the gate of said input FET to said reference voltage so as to provide zero volts across said detector;
temporarily shorting the gate and drain of said load FET;
disconnecting the gate of said input FET from said reference voltage;
disconnecting the short between the gate and drain of said load FET so as to bias said load FET to operate as a constant current load to said input FET, the level of said constant current load being equal to the current through said input FET when the base of said input FET is at said reference voltage;
irradiating said detector with infrared frequency energy;
feeding back to the gate of said feedback FET the portion of the current through said input FET in excess of said constant curent load level; and
generating an output from said feedback FET in response to said fedback current.

* * * * *